(12) United States Patent
Yase et al.

(10) Patent No.: US 10,965,165 B2
(45) Date of Patent: Mar. 30, 2021

(54) TAG CIRCUIT

(71) Applicant: OMRON Corporation, Kyoto (JP)

(72) Inventors: Satoshi Yase, Kyoto (JP); Tetsuya Nosaka, Kyoto (JP)

(73) Assignee: OMRON Corporation, Kyoto (JP)

( * ) Notice: Subject to any disclaimer, the term of this patent is extended or adjusted under 35 U.S.C. 154(b) by 27 days.

(21) Appl. No.: 16/347,722

(22) PCT Filed: Oct. 26, 2017

(86) PCT No.: PCT/JP2017/038688
§ 371 (c)(1),
(2) Date: May 6, 2019

(87) PCT Pub. No.: WO2018/138988
PCT Pub. Date: Aug. 2, 2018

(65) Prior Publication Data
US 2019/0334384 A1    Oct. 31, 2019

(30) Foreign Application Priority Data

Jan. 24, 2017    (JP) .............................. JP2017-010324

(51) Int. Cl.
*G05F 3/02*    (2006.01)
*G05F 1/10*    (2006.01)
(Continued)

(52) U.S. Cl.
CPC ............... *H02J 50/20* (2016.02); *H02M 3/07* (2013.01); *H02M 7/23* (2013.01); *H03H 11/28* (2013.01)

(58) Field of Classification Search
CPC .. H02M 3/073; H02M 3/07; H02M 2003/077; G11C 5/145; G05F 3/205
(Continued)

(56) References Cited

U.S. PATENT DOCUMENTS 5,943,271 A * 8/1999 Fujita .................... G11C 5/146
327/534
8,081,043 B2    12/2011 Rokhsaz
(Continued)

FOREIGN PATENT DOCUMENTS

CN        102073902 A      5/2011
CN        106026722 A     10/2016
(Continued)

OTHER PUBLICATIONS

An English translation of the International Search Report("ISR") of PCT/JP2017/038688 dated Jan. 9, 2018.
(Continued)

*Primary Examiner* — Quan Tra
(74) *Attorney, Agent, or Firm* — Metrolex IP Law Group, PLLC

(57) ABSTRACT

A tag circuit which allows a load connectable thereto to have a wider power consumption range and which is usable in a wider input power range is provided. The tag circuit includes: a control part which is configured to respond to a command extracted from a radio wave received by an antenna by controlling a load; and a rectifying part which is configured to generate DC power to be supplied to the control part and DC power to be supplied to the load by converting a radio wave received by the antenna into DC power, the rectifying part being capable of changing power conversion characteristics of converting the radio wave received by the antenna into DC power to be supplied to the load.

11 Claims, 17 Drawing Sheets

(51) Int. Cl.
*H02J 50/20* (2016.01)
*H02M 3/07* (2006.01)
*H02M 7/23* (2006.01)
*H03H 11/28* (2006.01)

(58) Field of Classification Search
USPC .......................................... 340/10.1; 327/536
See application file for complete search history.

(56) References Cited

U.S. PATENT DOCUMENTS

| | | | | |
|---|---|---|---|---|
| 8,115,597 | B1* | 2/2012 | Oliver | G06K 19/0713 |
| | | | | 235/375 |
| 8,326,256 | B1* | 12/2012 | Kuhn | G06K 19/0709 |
| | | | | 327/536 |
| 8,514,528 | B2* | 8/2013 | De Anna | H02M 1/32 |
| | | | | 361/37 |
| 9,601,994 | B2* | 3/2017 | Kim | G11C 5/145 |
| 2002/0130704 | A1 | 9/2002 | Myono et al. | |
| 2008/0079396 | A1 | 4/2008 | Yamazaki et al. | |
| 2008/0252254 | A1 | 10/2008 | Osada | |
| 2009/0045832 | A1 | 2/2009 | Brandl et al. | |
| 2011/0057610 | A1 | 3/2011 | Yamazaki et al. | |
| 2011/0187328 | A1 | 8/2011 | Yamazaki et al. | |
| 2012/0008714 | A1 | 1/2012 | Rizwan | |
| 2015/0340877 | A1 | 11/2015 | Lin et al. | |
| 2016/0055406 | A1 | 2/2016 | Sugata et al. | |
| 2016/0379104 | A1 | 12/2016 | Buescher | |
| 2017/0077996 | A1* | 3/2017 | Kim | H02J 7/025 |

FOREIGN PATENT DOCUMENTS

| | | |
|---|---|---|
| JP | 2002-064402 A | 2/2002 |
| JP | 5147345 B2 | 2/2013 |
| JP | 2014-045565 A | 3/2014 |
| JP | 2016-045778 A | 4/2016 |
| JP | 2017-017697 A | 1/2017 |
| KR | 10-0407100 B1 | 11/2003 |
| KR | 10-2011-0090285 A | 8/2011 |

OTHER PUBLICATIONS

An English translation of the Written Opinion("WO") of PCT/JP2017/038688 dated Jan. 9, 2018.
An extended European search report dated Jun. 2, 2020 in a counterpart European patent application.
Office Action (KROA) dated Nov. 20, 2020 in a counterpart Korean patent application.
Office Action (CNOA) dated Dec. 31, 2020 in a counterpart Chinese patent application.

* cited by examiner

TAG CIRCUIT

TECHNICAL FIELD

The present invention relates to a tag circuit connected to an antenna and a load.

BACKGROUND ART

It is common practice to connect tag circuits that operate using a radio wave received by an antenna as an energy source to a load (a sensor, an LED, an IC, a microcomputer, or the like) in order to enable control (utilization) of the load by radio (for example, refer to PTL 1 and PTL 2).

While tag circuits that operate using a radio wave received by an antenna as an energy source are mounted with a rectifier circuit that converts output (AC power) of the antenna into DC power, rectifier circuits come in a wide variety with respectively different power conversion characteristics. Specifically, as shown in FIG. 1, rectifier circuits include a rectifier circuit (configuration A) which provides high conversion efficiency (=output power/input power) when input power is large and a rectifier circuit (configuration B) which provides high conversion efficiency when input power is small.

In addition, since the conversion efficiency of a rectifier circuit also varies depending on power consumption of a load, as matters now stand, rectifier circuits for tag circuits are being designed and manufactured for each use environment (input power from an antenna and power consumption of a connected load) of the tag circuits.

CITATION LIST

Patent Literature

[PTL 1] Japanese Patent No. 5147345
[PTL 2] U.S. Pat. No. 8,081,043

SUMMARY OF INVENTION

Technical Problem

The present invention has been made in consideration of the current situation described above, and an object thereof is to provide a tag circuit which allows a load connectable thereto to have a wider power consumption range and which is usable in a wider input power range.

Solution to Problem

In order to solve the problem described above, a tag circuit connected to an antenna and a load according to the present invention includes: a control part which is configured to respond to a command extracted from a radio wave received by the antenna by controlling the load; and a rectifying part which is configured to generate DC power to be supplied to the load by converting a radio wave received by the antenna into DC power, the rectifying part being capable of changing power conversion characteristics of converting the radio wave into DC power to be supplied to the load.

In other words, the tag circuit according to the present invention includes a rectifier circuit capable of changing power conversion characteristics of converting a radio wave received by an antenna into DC power to be supplied to a load. In addition, a power consumption range of a load that can be connected to the tag circuit and an input power range from the antenna in which the tag circuit can be used are basically determined based on the power conversion characteristics of the rectifier circuit. Therefore, the tag circuit according to the present invention functions as a circuit which allows a load connectable thereto to have a wider power consumption range and which is usable in a wider input power range as compared to conventional tag circuits using a rectifier circuit of which power conversion characteristics are not variable.

A wide variety of rectifying parts with different specific configurations can be adopted as the rectifying part of the tag circuit according to the present invention. For example, the rectifying part may include: a multistage rectifier circuit in which N ($\geq 2$)-number of unit rectifier circuits are connected in multiple stages and which is configured so as to be capable of output from a plurality of intermediate stages including a final stage; and an output supply circuit which selectively supplies the load with an output of the multistage rectifier circuit.

The rectifying part may include: N ($\geq 2$)-number of rectifier circuits with mutually different power conversion characteristics; and an output supply circuit which selectively supplies the load with outputs of the N-number of rectifier circuits. Alternatively, the rectifying part may include: a charge pump constituted by diodes and capacitors; and a plurality of ON-resistance reducing elements which are connected in parallel to each diode of the charge pump and in which a switch and a diode are connected in series. It should be noted that the diodes constituting the charge pump may be diode-connected transistors.

The tag circuit according to the present invention may be realized as a circuit including a manual switch for changing (setting) power conversion characteristics of a rectifying part.

In addition, the tag circuit according to the present invention may be realized as a circuit in which a control part has a function of changing (setting) power conversion characteristics of a rectifying part. For example, the control part may be provided with a function of changing the power conversion characteristics of the rectifying part such that DC power supplied to the load from the rectifying part is maximum power.

In a tag circuit provided with a rectifying part including an output supply circuit, the control part may be provided with a function of controlling the output supply circuit such that DC power supplied to the load is maximum power. In addition, in a tag circuit provided with a rectifying part including a plurality of ON-resistance reducing elements, the control part may be provided with a function of controlling switches inside the plurality of ON-resistance reducing elements connected in parallel to each diode of the charge pump such that DC power supplied to the load is maximum power.

The control part of the tag circuit according to the present invention may be provided with a function of changing the power conversion characteristics of the rectifying part to power conversion characteristics which corresponds to an AC power value input to the rectifying part.

In addition, the tag circuit according to the present invention may adopt a control part which changes, when a command extracted from a radio wave received by the antenna is a power conversion characteristics designation command including designation information of power conversion characteristics of the rectifying part, the power conversion characteristics of the rectifying part to power conversion characteristics designated by the designation information in the power conversion characteristics designation command.

Furthermore, the tag circuit according to the present invention may adopt a control part which includes a rewritable nonvolatile memory for storing designation information that designates power conversion characteristics of the rectifying part and which changes the power conversion characteristics of the rectifying part to power conversion characteristics designated by the designation information stored in the nonvolatile memory when the control part becomes operable due to supply of DC voltage from the rectifying part. It should be noted that, by adopting such a control part, a tag circuit can be obtained in which setting appropriate designation information to the nonvolatile memory eliminates the need to change the power conversion characteristics of the rectifying part to suitable power conversion characteristics every time the tag circuit is activated (every time transmission of a radio wave by a reader/writer apparatus is interrupted and subsequently restarted).

In order to prevent a decline in energy transmission efficiency due to an impedance mismatch between an antenna and circuits in a tag circuit, the tag circuit according to the present invention may further include: a matching circuit portion for achieving impedance matching between the antenna and circuits in the tag circuit, the matching circuit portion being capable of adjusting impedance matching characteristics. When such a matching circuit portion is added to the tag circuit according to the present invention, the control part can be provided with a function of adjusting the impedance matching characteristics of the matching circuit portion to impedance matching characteristics which corresponds to the power conversion characteristics of the rectifying part.

Advantageous Effects of Invention

According to the present invention, a tag circuit can be provided which allows a load connectable thereto to have a wider power consumption range and which is usable in a wider input power range.

DESCRIPTION OF EMBODIMENTS

Hereinafter, embodiments of the present invention will be described with reference to the drawings.

First Embodiment

Figure 1:
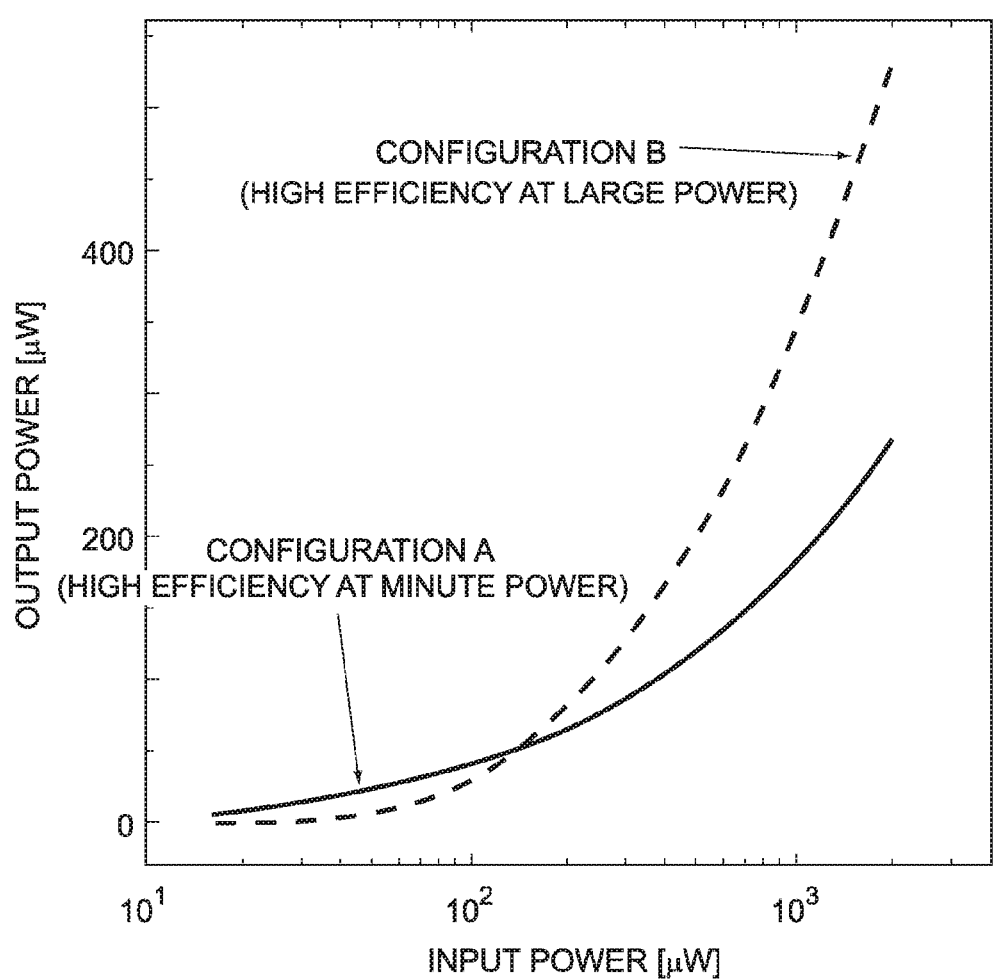
FIG. 1 is a diagram for illustrating a difference between configurations of current conversion characteristics of a rectifier circuit.
Figure 2:
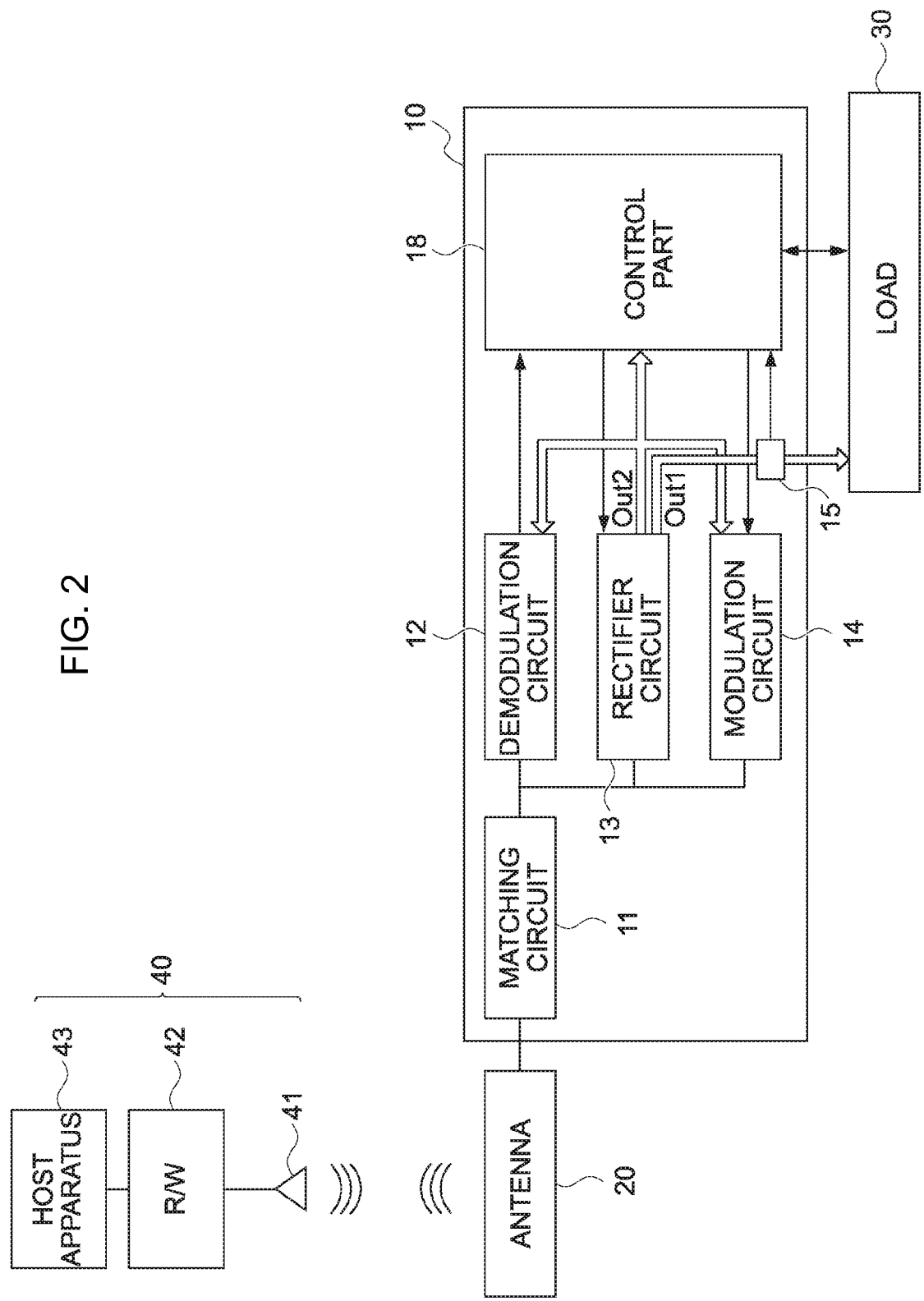
FIG. 2 is an explanatory diagram of a schematic configuration and a mode of use of a tag circuit according to a first embodiment of the present invention.

FIG. 2 shows a schematic configuration and a mode of use of a tag circuit 10 according to a first embodiment of the present invention. First, an overview of the tag circuit 10 according to the present embodiment will be described with reference to FIG. 2.

The tag circuit 10 according to the present embodiment is a circuit for constructing a system which enables a reader/writer apparatus 40 to utilize a load 30 such as a sensor, an LED, an IC, or a microcomputer via radio. It should be noted that the tag circuit 10 is realized as any of an IC chip, a circuit combining discrete components, and a circuit combining an IC chip with discrete components. In addition, the reader/writer apparatus 40 refers to an apparatus constructed by connecting a reader/writer (R/W) 42 mounted with an antenna 41 to a host apparatus 43 such as a computer.

As illustrated, the tag circuit 10 is a circuit to be used by being connected to an antenna 20 for receiving a radio wave from the reader/writer apparatus 40 (the antenna 41) and the load 30 to be utilized by the reader/writer apparatus 40. In addition, the tag circuit 10 includes a matching circuit 11, a demodulation circuit 12, a rectifier circuit 13, a modulation circuit 14, a voltage measurement circuit 15, and a control part 18.

The matching circuit 11 is a circuit for matching an impedance of the antenna 20 and an impedance of a circuit inside the tag circuit 10 with each other and to which an alternating current output from the antenna 20 is input. The demodulation circuit 12 is a circuit for extracting a command transmitted from the reader/writer apparatus 40 (the host apparatus 43) from a radio wave received by the antenna 20 by demodulating an output of the antenna 20 which is input via the matching circuit 11.

The modulation circuit 14 is a circuit for modulating a reflected wave of a carrier wave transmitted from the reader/writer apparatus 40.

The rectifier circuit 13 is a circuit for generating DC power for operating the load 30 and respective portions (the demodulation circuit 12, the modulation circuit 14, and the control part 18) in the tag circuit 10 by rectifying AC power output by the antenna 20 having received a radio wave. Although details will be provided later, the rectifier circuit 13 is configured so as to individually output DC power Out1 for operating the load 30 and DC power Out2 for operating the respective circuits in the tag circuit 10. The rectifier circuit 13 is also configured so as to enable power conversion characteristics for converting the AC power from the antenna 20 into the DC power Out1 to be changed from outside. It should be noted that the power conversion characteristics for converting the AC power from the antenna 20 into the DC power Out1 (hereinafter, simply described as power conversion characteristics) refer to characteristics related to a correspondence relationship between input power (the AC power from the antenna 20) and output power (the DC power Out1) (the correspondence relationship itself, input power dependence of conversion efficiency, or the like).

The voltage measurement circuit 15 is a circuit for measuring voltage of the DC power Out1 output from the rectifier circuit 13.

The control part 18 is a unit which responds to a command extracted by the demodulation circuit 12 by controlling the load 30 and the modulation circuit 14. The control part 18 is provided with a function of setting and/or changing power conversion characteristics of the rectifier circuit 13.

Based on the above premises, a configuration and operations of the tag circuit 10 according to the present embodiment will now be described in further detail.

Figure 3:
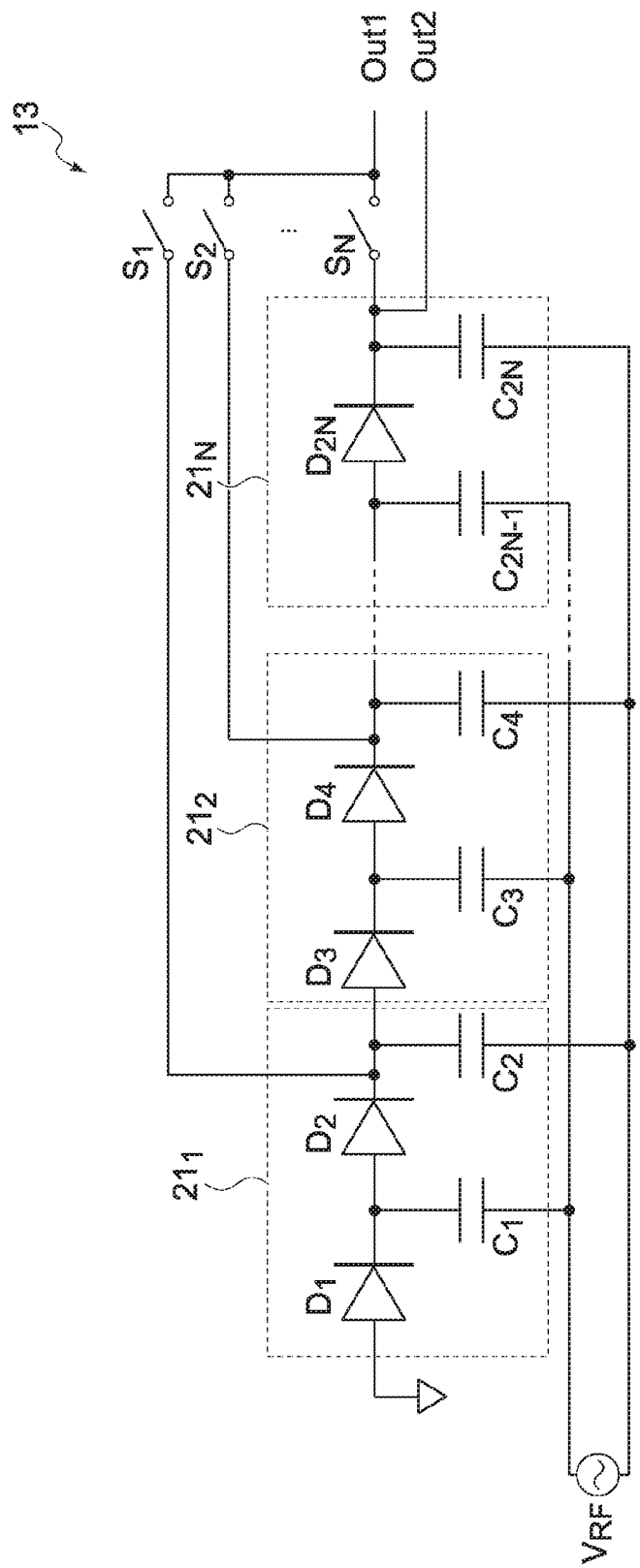
FIG. 3 is a configuration diagram of a rectifier circuit included in the tag circuit according to the first embodiment.

FIG. 3 shows a configuration of the rectifier circuit 13. It should be noted that, in FIG. 3 and in the following description, $V_{REF}$ refers to AC voltage input to the rectifier circuit 13.

As shown in FIG. 3, the rectifier circuit 13 is basically a diode charge pump in which a unit rectifier circuit 21 constituted by two diodes D ($D_1$ and $D_2$ or the like) and two capacitors C ($C_1$ and $C_2$ or the like) are connected in N-number of stages. However, the rectifier circuit 13 includes switches $S_1$ to $S_N$ for making Out1 an output of each of the unit rectifier circuits $21_1$ to $21_N$. In addition, the rectifier circuit 13 is configured so as to make Out2 the output of the unit rectifier circuit $21_N$.

In other words, the rectifier circuit 13 is configured as a circuit capable of functioning as any of N-number of rectifier circuits of which the number of connected stages ranges from one stage to N-number of stages (in other words, N-number of rectifier circuits with respectively different power conversion characteristics) by changing switches to be turned ON.

Figure 4:
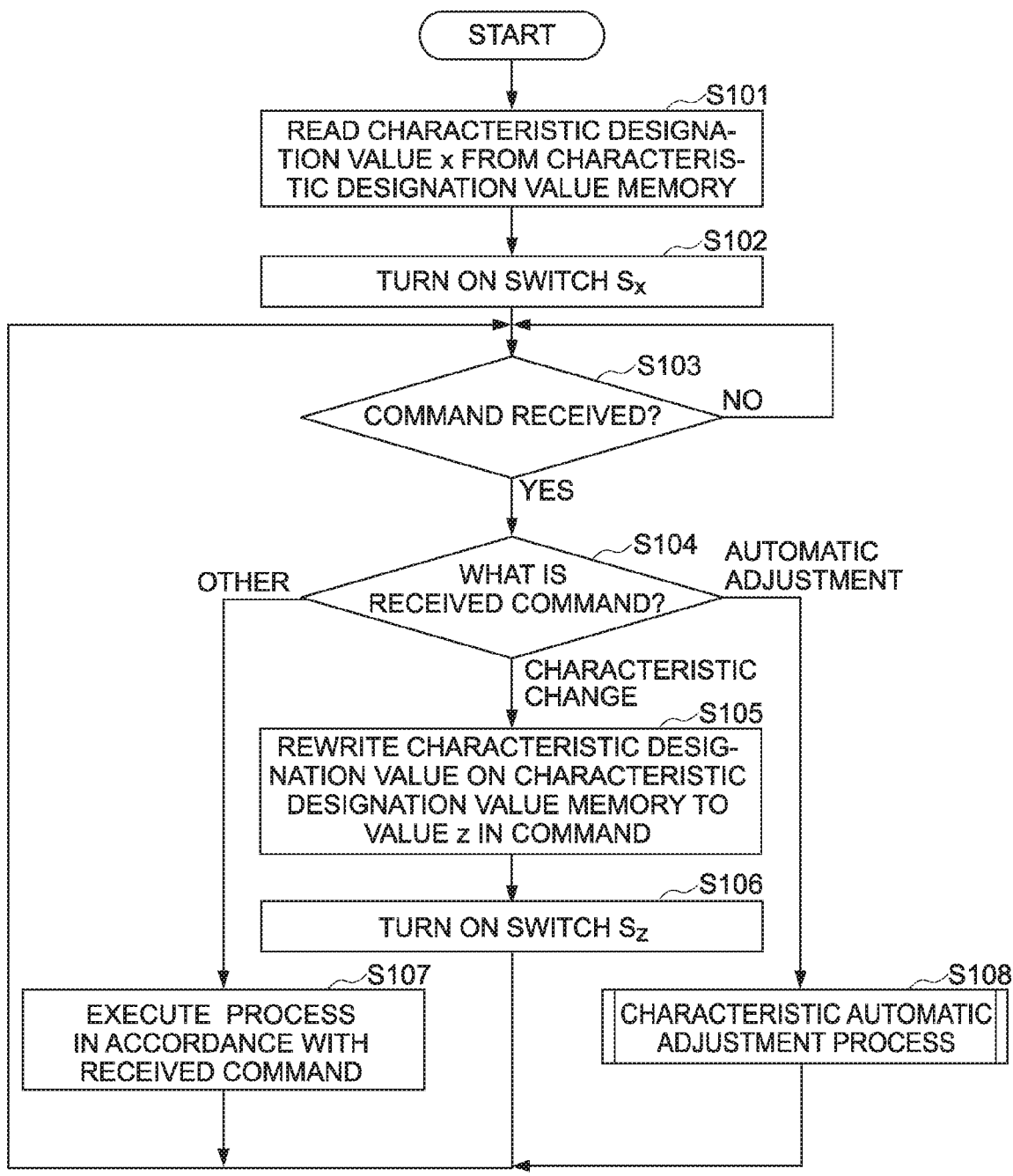
FIG. 4 is a flow chart of a command response process executed by a control part included in the tag circuit according to the first embodiment.

In addition, the control part 18 is configured so as to start a command response process of which procedures are as shown in FIG. 4 when power necessary for operation is supplied from the rectifier circuit 13. It should be noted that, in FIG. 4 and in the following description, to "turn ON switch $S_y$" means to "create a state where only switch $S_y$ is turned ON". Furthermore, for the sake of brevity, a portion of the rectifier circuit 13 which outputs Out1 will be hereinafter simply described as the rectifier circuit 13.

The control part 18 having started the command response process due to supply of power from the rectifier circuit 13 first reads a characteristic designation value x from a characteristic designation value memory (step S101). In this case, a characteristic designation value refers to information for designating power conversion characteristics of the rectifier circuit 13 (the portion that outputs Out1 of the rectifier circuit 13) by identification information (an integer value ranging from 1 to N) of a switch to be turned ON. In addition, the characteristic designation value memory refers to a rewritable nonvolatile memory provided in the control part 18 for storing the characteristic designation value. It should be noted that the tag circuit 10 is shipped in a state where at least 1 and not more than N-number of initial values are written in the characteristic designation value memory.

The control part 18 having finished the process of step S101 turns on a switch $S_x$ in the rectifier circuit 13 designated by the read characteristic designation value x (step S102). Subsequently, in step S103, the control part 18 stands by until a command is received (a command is input from the demodulation circuit 12). In addition, when any command is received (step S103: YES), the control part 18 determines whether the received command is a characteristic change instruction command, an automatic adjustment instruction command, or another command (step S104).

The automatic adjustment instruction command is a command for instructing automatic adjustment of a characteristic designation value of the rectifier circuit 13. When the received command is the automatic adjustment instruction command (step S103: automatic adjustment), the control part 18 executes an automatic characteristic adjustment process in step S108.

Figure 5:
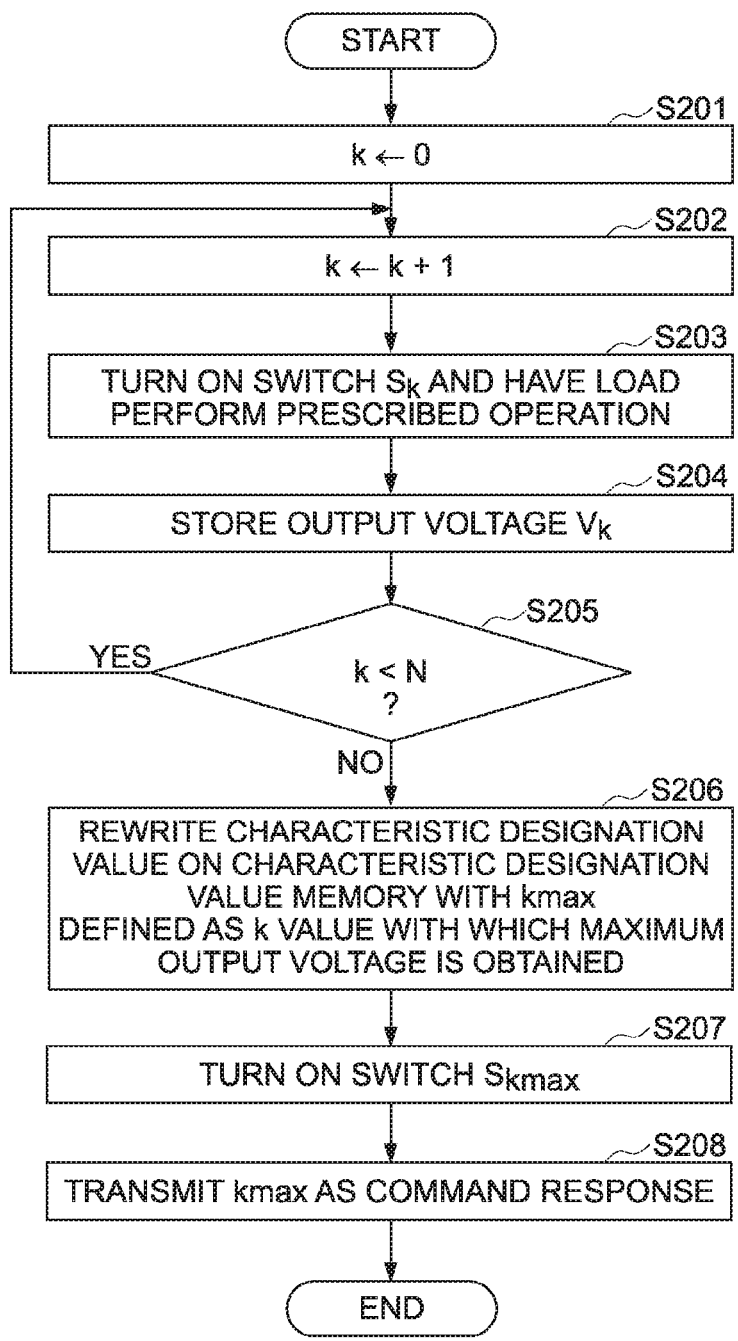
FIG. 5 is a flow chart of an automatic characteristic adjustment process executed during the command response process shown in FIG. 4.

The automatic characteristic adjustment process executed by the control part 18 is a process including procedures shown in FIG. 5. Specifically, the control part 18 having started the automatic characteristic adjustment process first sets a variable k to "0" (step S201). Next, the control part adds "1" to the variable k (step S202) and, after creating a state where only a switch $S_k$ is turned ON, performs a process of causing the load 30 to perform a prescribed operation (step S106). In this case, a prescribed operation refers to an operation of which contents are determined in advance such that an amount of power consumption by the load 30 until completion of the operation matches an average amount of power consumption by the load 30 when responding to the command.

Once the process of step S106 is completed (once the prescribed operation of the load 30 is completed), the control part 18 internally stores output power measured by the voltage measurement circuit 15 as $V_k$ (step S204). In other words, the control part 18 internally stores, as $V_k$, output voltage of the rectifier circuit 13 (the unit rectifier circuit $21_k$ inside the rectifier circuit 13) having dropped due to the operation (power consumption) by the load 30.

The control part 18 having finished the process of step S204 determines whether or not k<N is satisfied (step S206). When k<N is satisfied (step S206: YES), the control part 18 restarts processes of steps S202 and thereafter.

The control part 18 repeats the processes described above until k=N is satisfied. When k=N is satisfied (step S205: NO), based on $V_1$ to $V_N$, the control part 18 identifies kmax that is a k value for which maximum output voltage is obtained and rewrites the characteristic designation value on the characteristic designation value memory with the identified kmax (step S206). Subsequently, the control part 18 turns ON a switch $S_{kmax}$ (step S207).

In other words, the higher a power conversion efficiency of the rectifier circuit 13 (a portion that outputs Out1 of the rectifier circuit 13), the higher the output voltage of the rectifier circuit 13 after having the load 30 perform the prescribed operation. Therefore, in the procedure described above, the power conversion characteristics of the rectifier circuit 13 can be adjusted so as to suit the present situation.

The control part 18 having finished the process of step S207 transmits (returns) kmax to the reader/writer apparatus 40 as a response to the automatic adjustment instruction command (step S208). Subsequently, the control part 18 ends the automatic characteristic adjustment process and returns to step S103 (FIG. 4) to stand by for (monitor) reception of a command.

The characteristic change instruction command is a command with prescribed contents which include the characteristic designation value x as an operand. When a proper characteristic designation value is known or the like, a user of the tag circuit 10 operates the reader/writer apparatus 40 so that the characteristic change instruction command is transmitted.

When the received command is the characteristic change instruction command (step S104: characteristic change), the control part 18 rewrites the characteristic designation value on the characteristic designation value memory to a characteristic designation value z included in the characteristic change instruction command (step S105). Subsequently, the control part 18 turns ON a switch S: in the rectifier circuit 13 (step S106). In addition, the control part 18 returns to step S103 to stand by until a command is received.

When the received command is neither the characteristic change instruction command nor the automatic adjustment instruction command (step S104: other), in step S107, the control part 18 executes a process in accordance with the received command (a process of operating the load 30 or a process of returning information obtained by operating the load 30). In addition, the control part 18 having finished the process of step S107 returns to step S103 to stand by until a command is received.

As described above, the tag circuit 10 according to the present embodiment includes the rectifier circuit 13 (FIG. 3) capable of selecting power conversion characteristics from N-number of types of power conversion characteristics. In addition, a power consumption range of a load that can be connected to a circuit such as the tag circuit 10 and an input power range from an antenna in which the circuit can be used are basically determined based on the power conversion characteristics of the rectifier circuit. Therefore, the tag circuit 10 according to the present embodiment is configured as a circuit which allows a load connectable thereto to have a wider power consumption range and which is usable in a wider input power range as compared to conventional tag circuits using a rectifier circuit of which power conversion characteristics are not variable.

Second Embodiment

Hereinafter, using the same reference numerals as used in the description of the tag circuit 10 according to the first embodiment, a configuration and operations of the tag circuit 10 according to a second embodiment will now be described with a focus on portions that differ from the tag circuit 10 according to the first embodiment. In addition, in the description of the respective embodiments provided below, the tag circuit 10 and the rectifier circuit 13 of the tag circuit 10 according to an L-th embodiment will also be respectively described as an L-th tag circuit 10 and an L-th rectifier circuit 13.

Figure 6:
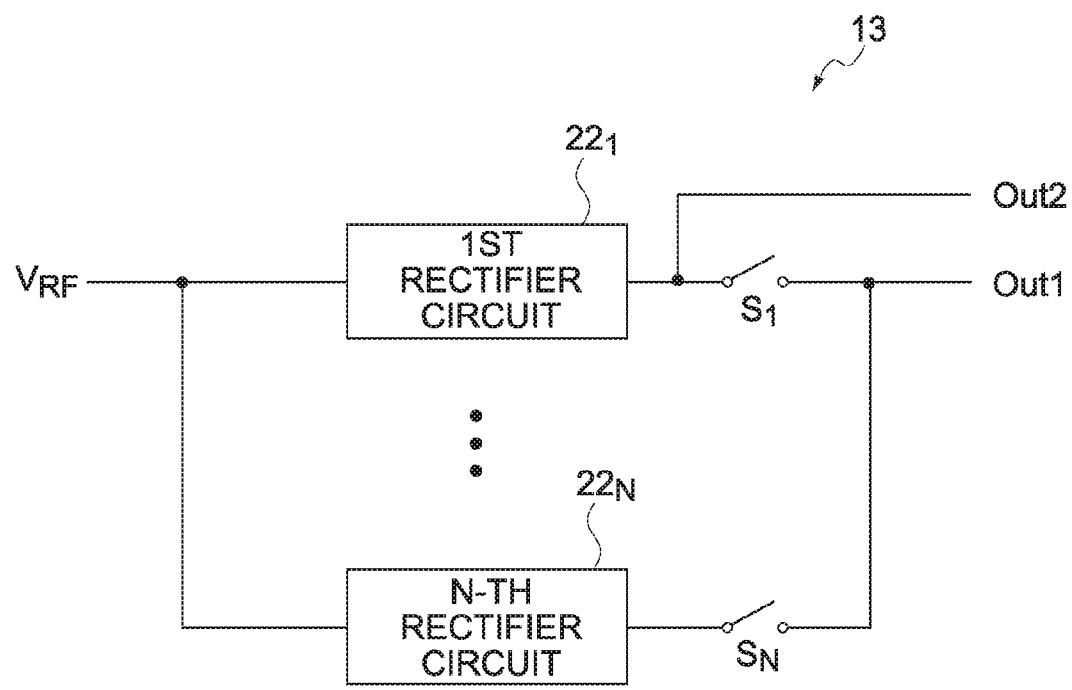
FIG. 6 is a block diagram of a rectifier circuit included in a tag circuit according to a second embodiment of the present invention.

The second tag circuit 10 is a circuit created by replacing the rectifier circuit 13 (FIG. 3) of the first tag circuit 10 with the rectifier circuit 13 configured as shown in FIG. 6.

Figure 7:
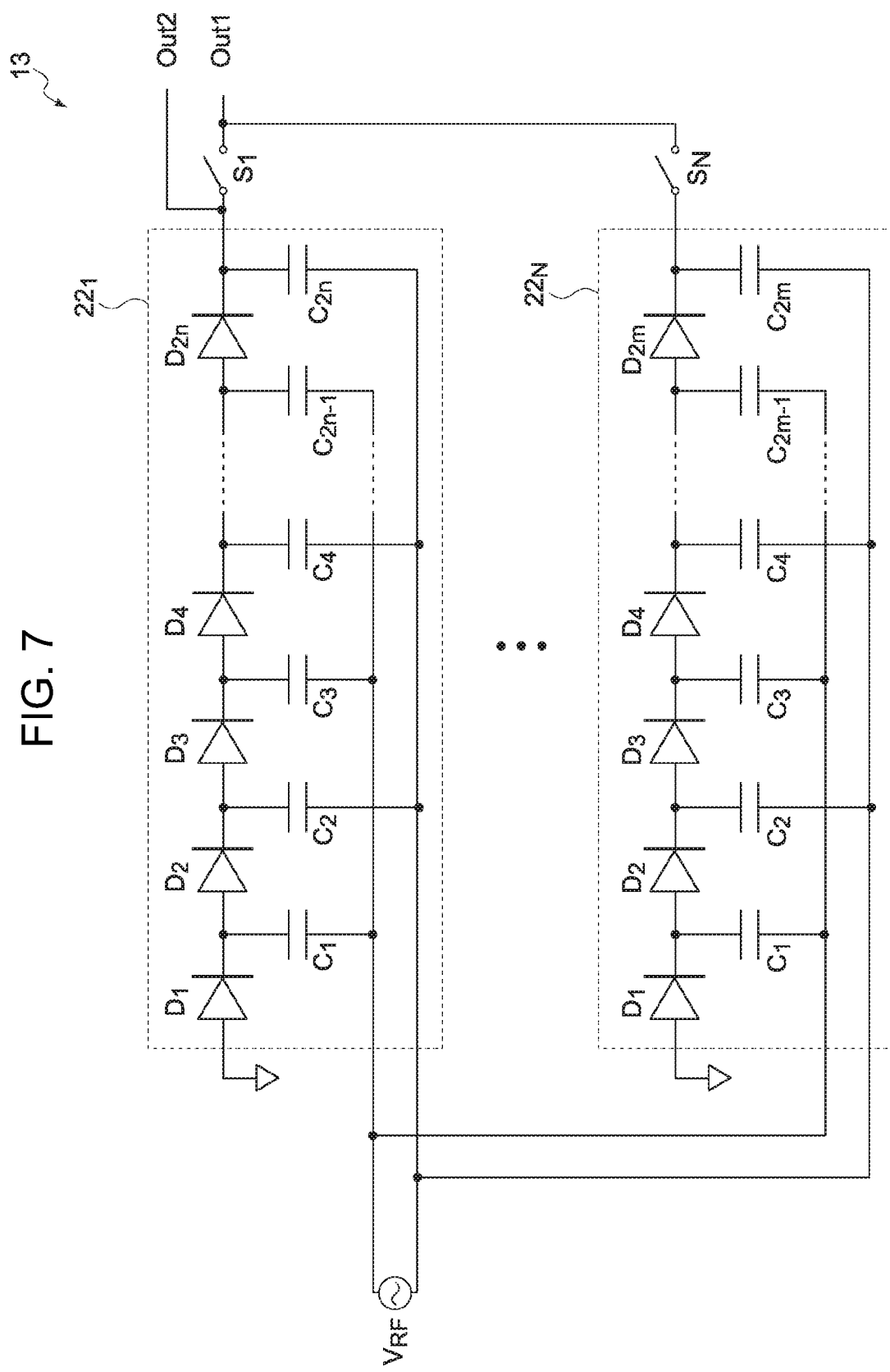
FIG. 7 is an explanatory diagram of a specific circuit example of the rectifier circuit shown in FIG. 6.

In other words, a second rectifier circuit 13 (the rectifier circuit 13 of the tag circuit 10 according to the second embodiment) includes a first rectifier circuit $22_1$ to an N-th rectifier circuit $22_N$ and switches $S_1$ to $S_N$ for making Out1 an output of each of the N-number of rectifier circuits $22_1$ to $22_N$. In addition, the second rectifier circuit 13 is a circuit configured such that, power conversion characteristics of the first rectifier circuit $22_1$ to the N-th rectifier circuit $22_N$ differ from each other and, at the same time, output of the first rectifier circuit $22_1$ is Out2. It should be noted that the first rectifier circuit $22_1$ to the N-th rectifier circuit $22_N$ of the second rectifier circuit 13 may adopt any circuit, configuration as long as power conversion characteristics differ from each other. Therefore, as the first rectifier circuit $22_1$ to the N-th rectifier circuit $22_N$, for example, diode charge pump circuits with mutually different numbers of stages can be adopted as schematically shown in FIG. 7.

The second rectifier circuit 13 configured as described above is also a circuit of which power conversion characteristics can be selected from N-number of types of power conversion characteristics. In addition, the second rectifier circuit 13 is capable of the same control (refer to FIGS. 4 and 5) as the first rectifier circuit 13. Therefore, the tag circuit 10 according to the present embodiment also functions as a circuit which allows a load connectable thereto to have a wider power consumption range and which is usable in a wider input power range as compared to conventional tag circuits using a rectifier circuit of which power conversion characteristics are not variable.

Third Embodiment

Hereinafter, using the same reference numerals as used in the description of the tag circuit 10 according to the first embodiment, a configuration and operations of the tag circuit 10 according to a third embodiment of the present invention will now be described with a focus on portions that differ from the tag circuit 10 according to the first embodiment.

Figure 8:
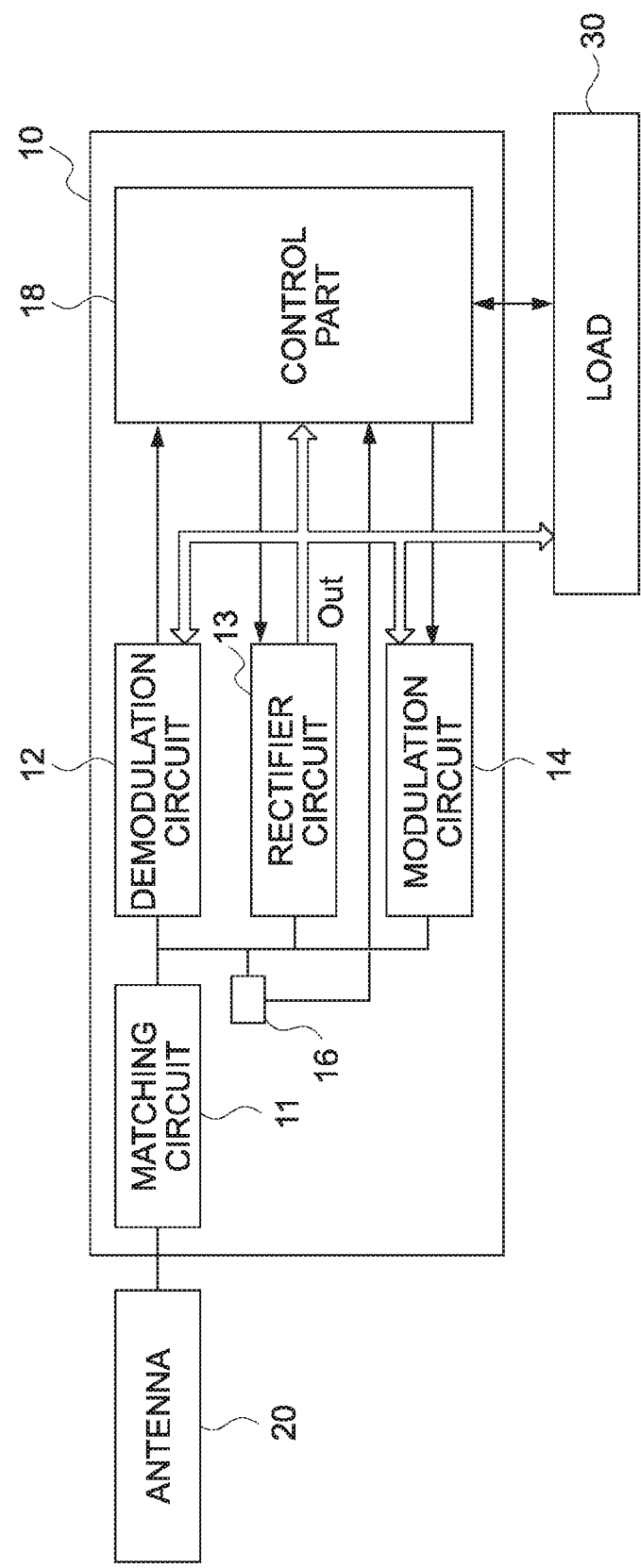
FIG. 8 is an explanatory diagram of a schematic configuration of a tag circuit according to a third embodiment of the present invention.

FIG. 8 shows a schematic configuration of the tag circuit 10 according to the third embodiment of the present invention.

The matching circuit 11, the demodulation circuit 12, and the modulation circuit 14 of a third tag circuit 10 (the tag circuit 10 according to the third embodiment) are respectively the same as the matching circuit 11, the demodulation circuit 12, and the modulation circuit 14 of the first tag circuit 10.

Figure 9:
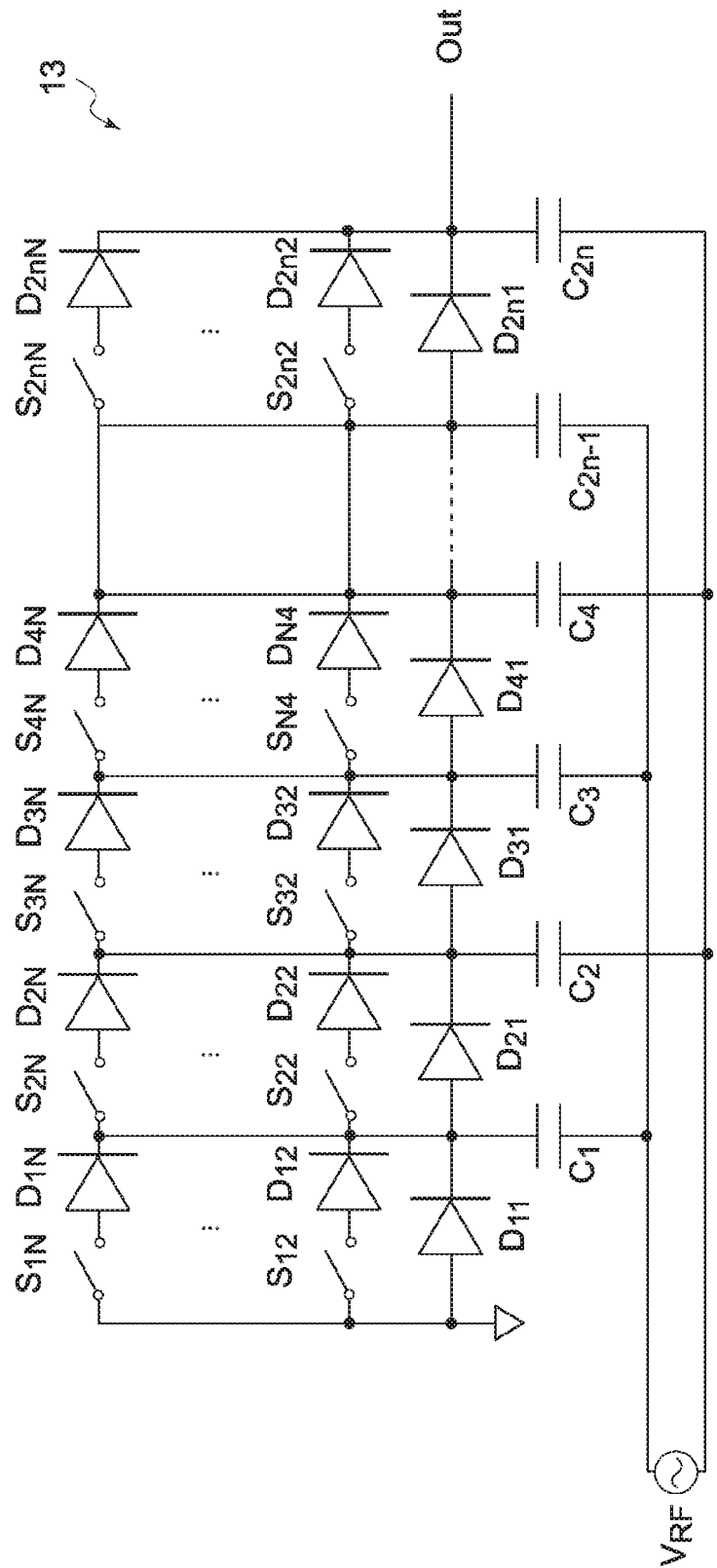
FIG. 9 is a configuration diagram of a rectifier circuit included in the tag circuit according to the third embodiment.
Figure 10:
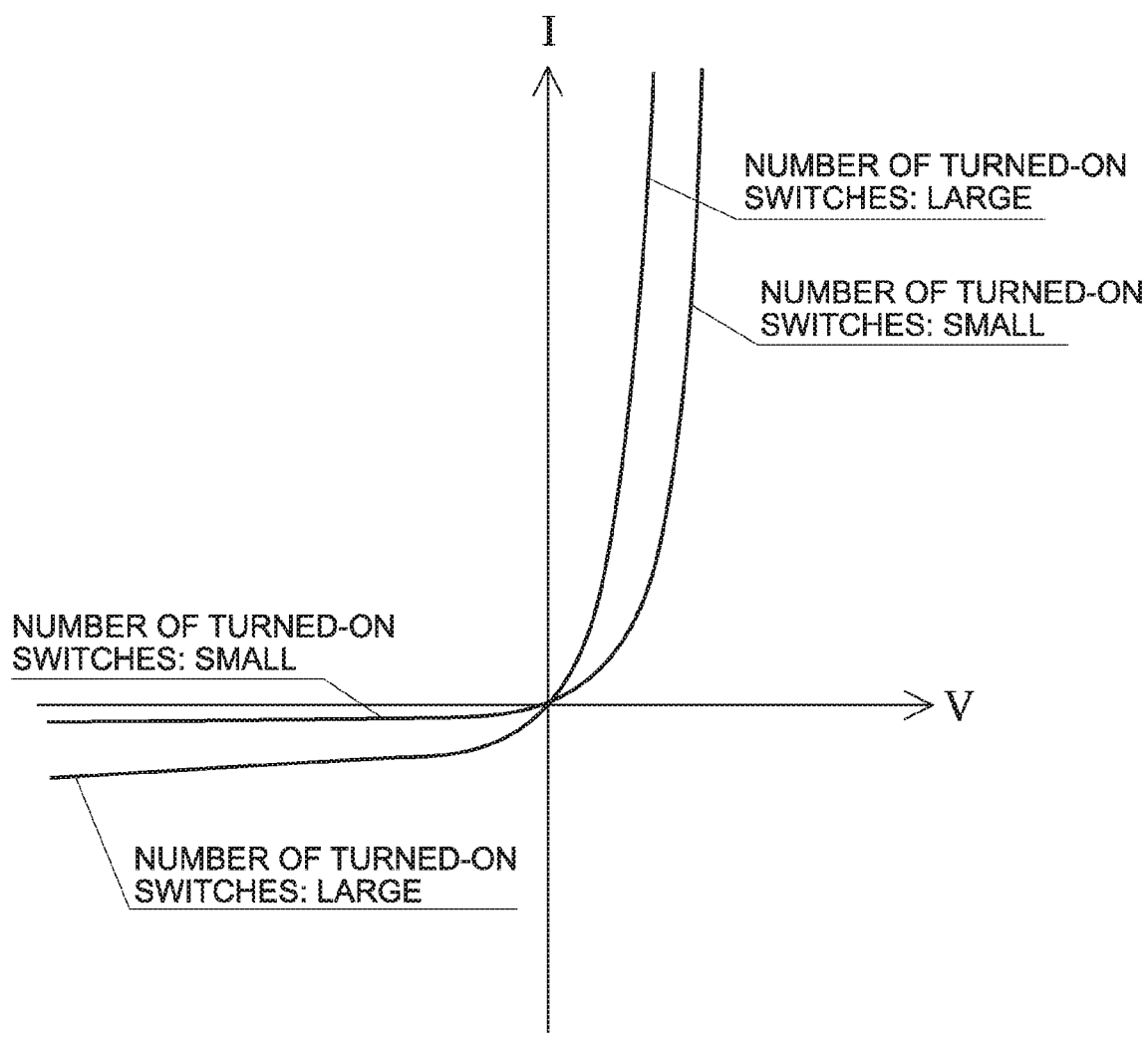
FIG. 10 is a V-I characteristic diagram for illustrating a function of the rectifier circuit shown in FIG. 9.

A third rectifier circuit 13 (the rectifier circuit 13 of the third tag circuit 10) is a circuit configured as shown in FIG. 9. In other words, the third rectifier circuit 13 is configured such that N-1-number of ON-resistance reducing elements in which a switch and a diode are connected in series are connected in parallel to each of the diodes ($D_{11}$, $D_{12}$, and the like) of a diode charge pump. In addition, the third rectifier circuit 13 is a circuit in which an output Out of a final stage of the diode charge pump is used to operate the load 30 and the respective circuits inside the third tag circuit 10.

A function of the third rectifier circuit 13 will now be described.

Figure 11:
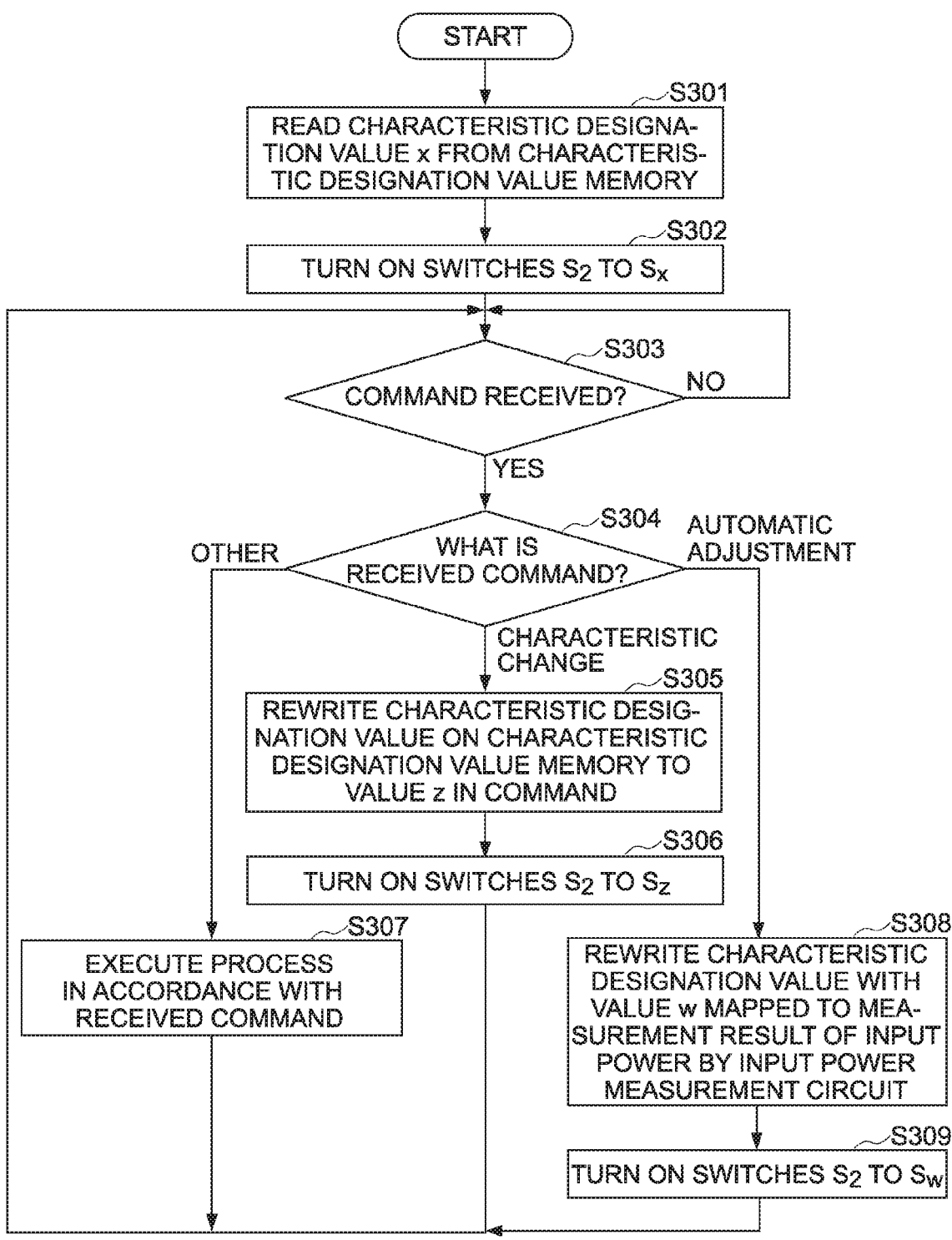
FIG. 11 is a flow chart of a command response process executed by a control part included in the tag circuit according to the third embodiment.

V-I characteristics of each portion where the diodes and the N-1-number of ON-resistance reducing elements are connected in parallel in the third rectifier circuit 13 change as shown in FIG. 11 depending on the number of switches that are turned ON among switches $S_{P2}$ to $S_{PN}$ (where P=1 to N). In other words, ON-resistance of each portion decreases as the number of ON-switches (the number of switches that are turned ON) increases. However, when the number of ON-switches (the number of switches that are turned ON) increases, loss during reverse bias at each portion increases.

Although conversion efficiency declines if loss during reverse bias is large when input power is low, conversion efficiency is hardly adversely affected by a large loss during reverse bias when input power is high. Therefore, by using the third rectifier circuit 13 configured as described above in a state where the number of ON-switches is reduced, the third rectifier circuit 13 functions as a rectifier circuit capable of efficiently converting low input power into DC power. In addition, by using the third rectifier circuit 13 in a state where the number of ON-switches is increased, the third rectifier circuit 13 functions as a rectifier circuit capable of efficiently converting high input power into DC power.

Returning to FIG. 8, the description of the third tag circuit 10 will be continued.

Since the third rectifier circuit 13 is a circuit as described above, the third tag circuit 10 is provided with an input power measurement circuit 16 for measuring input power to the third rectifier circuit 13. The input power measurement circuit 16 may be configured so as to measure AC voltage and current and calculate input power from a measurement result thereof or to convert AC into DC and calculate input power from the converted DC voltage and current.

In addition, the control part 18 of the third tag circuit 10 (hereinafter, also described as a third control part 18) is configured so as to start a command response process of which procedures are shown in FIG. 11 when power necessary for operation is supplied from the third rectifier circuit 13. It should be noted that, in FIG. 11 and in the following description, switches $S_y$ (y=2 to N) refer to switches $S_{y1}$ to $S_{y2n}$ (refer to FIG. 9).

As shown in FIG. 11, the control part 18 having started the command response process first reads a characteristic designation value x from a characteristic designation value memory (step S301).

Next, the control part 18 turns ON the switches $S_2$ to $S_x$ in the third rectifier circuit 13 (step S302). It should be noted that in the processes of the current step S302 and steps S306 and S307 to be described later, a process of turning OFF each switch having been turned ON with the exception of the switches that need to be turned ON is also performed.

Subsequently, in step S303, the control part 18 stands by until a command is received. In addition, when any command is received (step S303: YES), the control part 18 determines whether the received command is a characteristic change instruction command, an automatic adjustment instruction command, or another command (step S304).

When the received command is the characteristic change instruction command (step S304: characteristic change), the control part 18 rewrites the characteristic designation value on the characteristic designation value memory to a characteristic designation value z included in the characteristic change instruction command (step S305). Subsequently, the control part 18 turns ON the switches $S_2$ to $S_z$ in the rectifier circuit 13 (step S306). In addition, the control part 18 returns to step S303 to stand by until a command is received.

When the received command is the automatic adjustment instruction command (step S304: automatic adjustment), the control part 18 obtains a measurement result of input power from the input power measurement circuit 16 and rewrites the characteristic designation value on the characteristic designation value memory to a characteristic designation value w associated with the measurement result (step S308).

In addition, after performing a process of turning ON the switches to $S_2$ to $S_w$ in the rectifier circuit 13 (step S309), the control part 18 returns to step S303 to stand by until a command is received.

When the received command is neither the characteristic change instruction command nor the automatic adjustment instruction command (step S304: other), in step S307, the control part 18 executes a process in accordance with the received command (a process of operating the load 30 or a process of returning information obtained by operating the load 30). In addition, the control part 18 having finished the process of step S307 returns to step S303 to stand by until a command is received.

As described above, the tag circuit 10 according to the present embodiment also includes the rectifier circuit 13 capable of selecting power conversion characteristics from N-number of types of power conversion characteristics. In addition, a power consumption range of a load that can be connected to a circuit such as the tag circuit 10 and an input power range from an antenna in which the circuit can be used are basically determined based on the power conversion characteristics of the rectifier circuit. Therefore, the tag circuit 10 according to the present embodiment also functions as a circuit which allows a load connectable thereto to have a wider power consumption range and which is usable in a wider input power range as compared to conventional tag circuits using a rectifier circuit of which power conversion characteristics are not variable.

Fourth Embodiment

Hereinafter, using the same reference numerals as used in the description of the tag circuit 10 according to the third embodiment, a configuration and operations of the tag circuit 10 according to a fourth embodiment of the present invention will now be described.

While an impedance of the rectifier circuit 13 may change due to a change in power conversion characteristics in the tag circuit 10 according to the respective embodiments described above, when the impedance of the rectifier circuit 13 changes, an impedance of the circuits inside the tag circuit 10 (a combined impedance of the rectifier circuit 13 and the demodulation circuit 12) changes In addition, when an impedance mismatch between the antenna 20 and the circuits inside the tag circuit 10 increases due to the change in the impedance of the circuits inside the tag circuit 10, energy transmission efficiency from the antenna 20 to the circuits inside the tag circuit 10 declines.

The tag circuit 10 according to the present embodiment is a modification of the tag circuit 10 according to the third embodiment described above in order to prevent an occurrence of such problems.

Specifically, a fourth tag circuit 10 (the tag circuit 10 according to the fourth embodiment) is basically a circuit with a same configuration as the third tag circuit 10 (the tag circuit 10 according to the third embodiment: FIG. 8). However, in the fourth tag circuit 10, a circuit capable of adjusting impedance matching characteristics by a control signal from the control part 18 is used as the matching circuit 11. In addition, the control part 18 of the fourth tag circuit 10 is configured so as to perform a command response process which differs from that performed by the control part 18 of the third tag circuit 10.

Figure 12A:
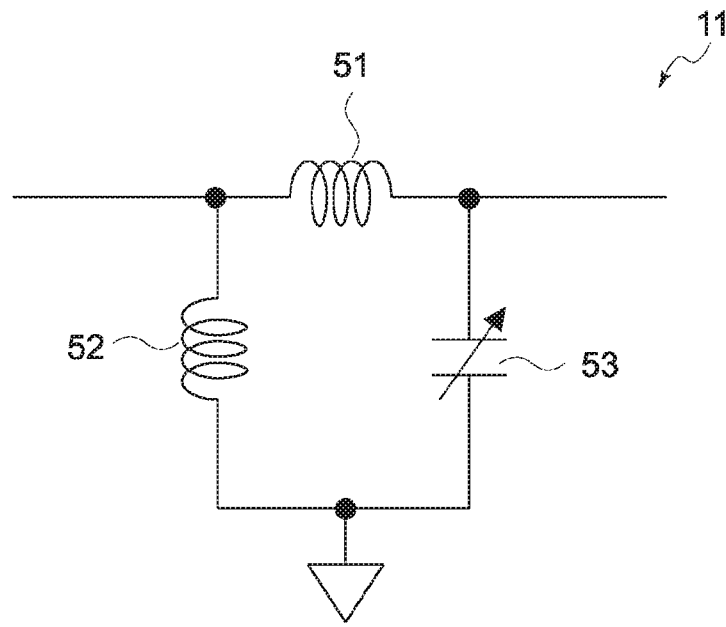
FIG. 12A is an explanatory diagram of a configuration example of a matching circuit capable of adjusting (changing) impedance matching characteristics.
Figure 12B:
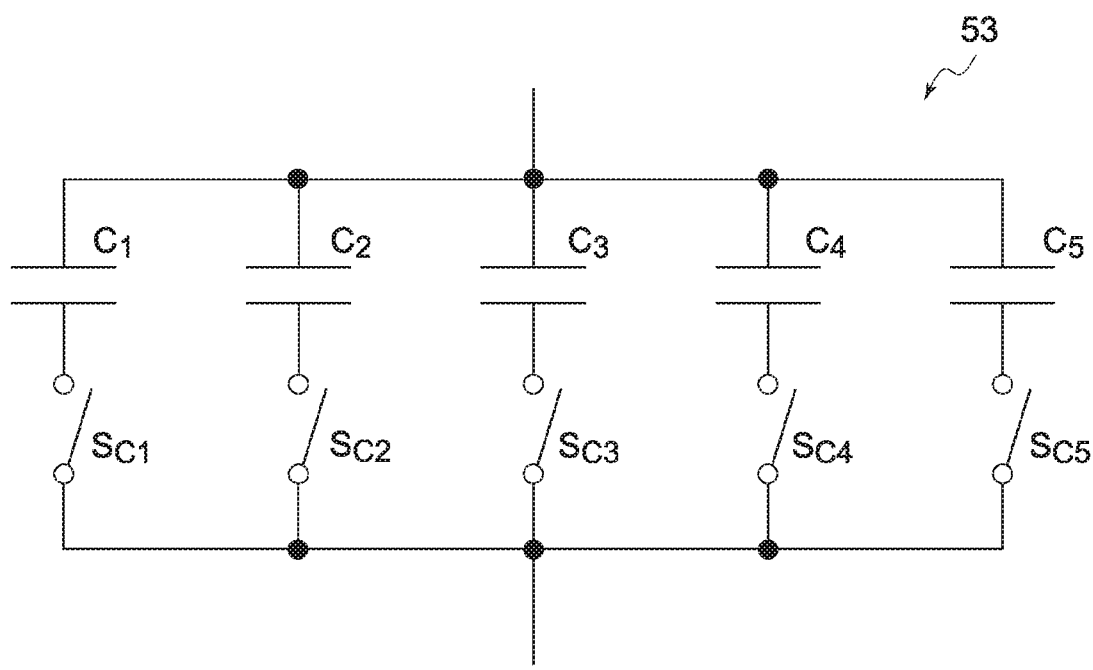
FIG. 12B is an explanatory diagram of a configuration example of a variable capacitor capable of changing a capacity due to a control signal.

A specific circuit configuration of the matching circuit 11 (hereinafter, also described as a snatching characteristics variable matching circuit 11) capable of adjusting impedance matching characteristics by a control signal from the control part 18 is not particularly limited. For example, as shown in FIG. 12A, a circuit combining two inductors 51 and 52 and a variable capacitor 53 of which a capacity can be changed by a control signal from the control part 18 can be used as the matching characteristics variable matching circuit 11. As the variable capacitor 53 of which a capacity can be changed by a control signal from the control part 18, for example, a circuit in which capacitors $C_1$ to $C_5$ with mutually different capacities and switches $S_{C1}$ to $S_{C5}$ are combined as shown in FIG. 12B can be used. Alternatively, the matching characteristics variable matching circuit 11 may be a circuit configured so that the inductors have variable capacities.

Figure 13:
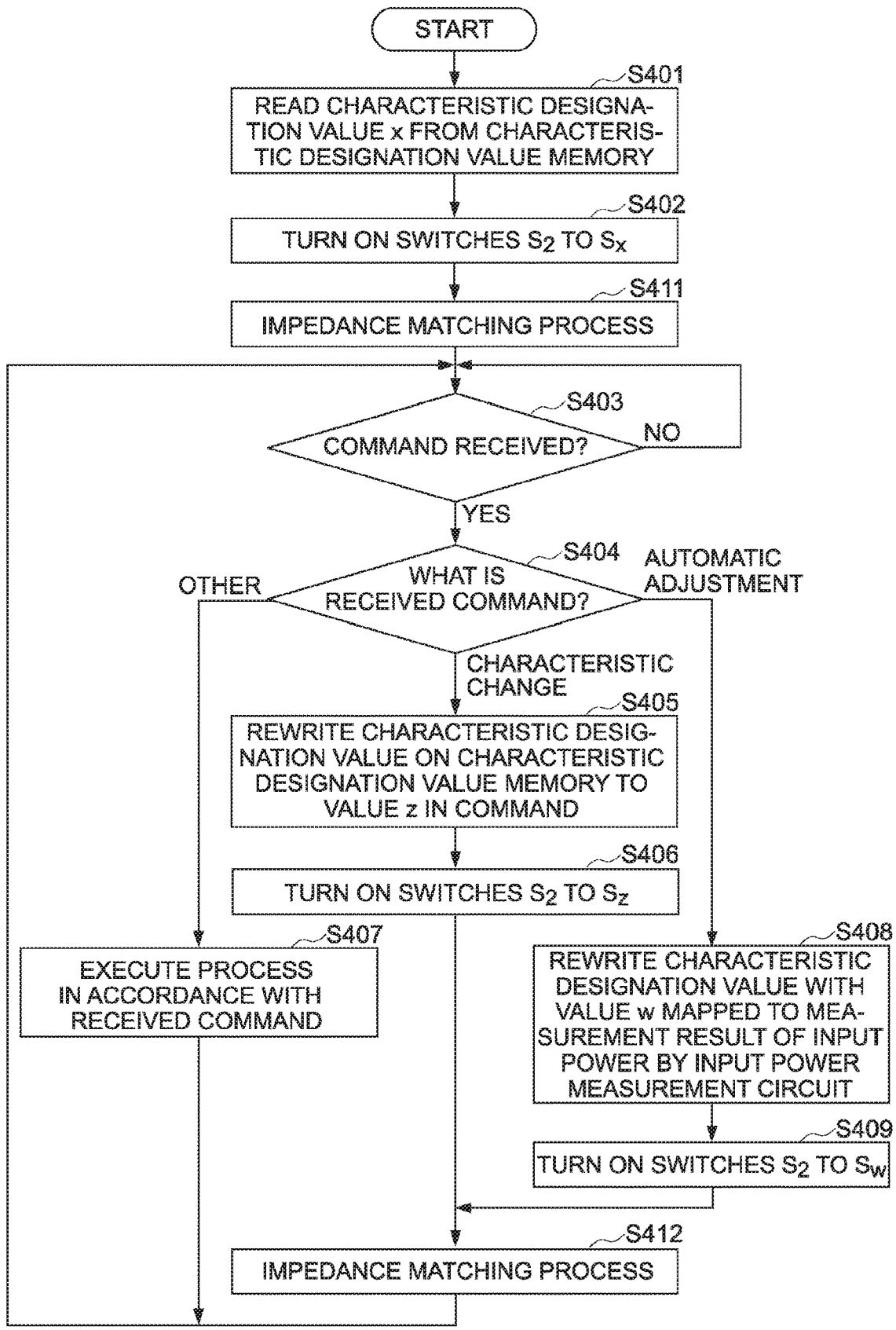
FIG. 13 is a flow chart of a command response process executed by a control part included in a tag circuit according to a fourth embodiment of the present invention.

The command response process performed by the control part 18 of the fourth tag circuit 10 is a process including procedures shown in FIG. 13.

Processes of steps S401 to S409 of the present command response process are respectively the same as the processes of steps S301 to S309 of the command response process (FIG. 11) performed by the control part 18 of the fourth tag circuit 10.

An impedance matching process executed in steps S411 and S412 after the processes of steps S402, S406, and S409 (in other words, processes of changing the power conversion characteristics of the rectifier circuit 13) is a process of controlling the matching characteristics variable matching circuit 11 so as to maximize input power to the rectifier circuit 13. When the matching characteristics variable matching circuit 11 is a circuit with the configuration shown in FIGS. 12A and 12B, as the impedance matching process, a process is performed involving storing a measurement result of input power to the rectifier circuit 13 by the input power measurement circuit 16 while turning ON the switches $S_{C1}$ to $S_{C6}$ one by one and turning ON the switch having produced maximum input power.

As described above, the tag circuit 10 according to the present embodiment includes a matching circuit 11 (a matching characteristics variable matching circuit 11) capable of adjusting impedance matching characteristics. In addition, in the tag circuit 10 according to the present embodiment, when power conversion characteristics of the rectifier circuit 13 changes, the impedance matching characteristics of the matching circuit 11 are adjusted to impedance matching characteristics most suitable for a state after the change. Therefore, with the tag circuit 10 according to the present embodiment, a change in the power conversion characteristics of the rectifier circuit 13 can be prevented from increasing an impedance mismatch between the antenna 20 and the circuits inside the tag circuit 10.

Modifications

Figure 14:
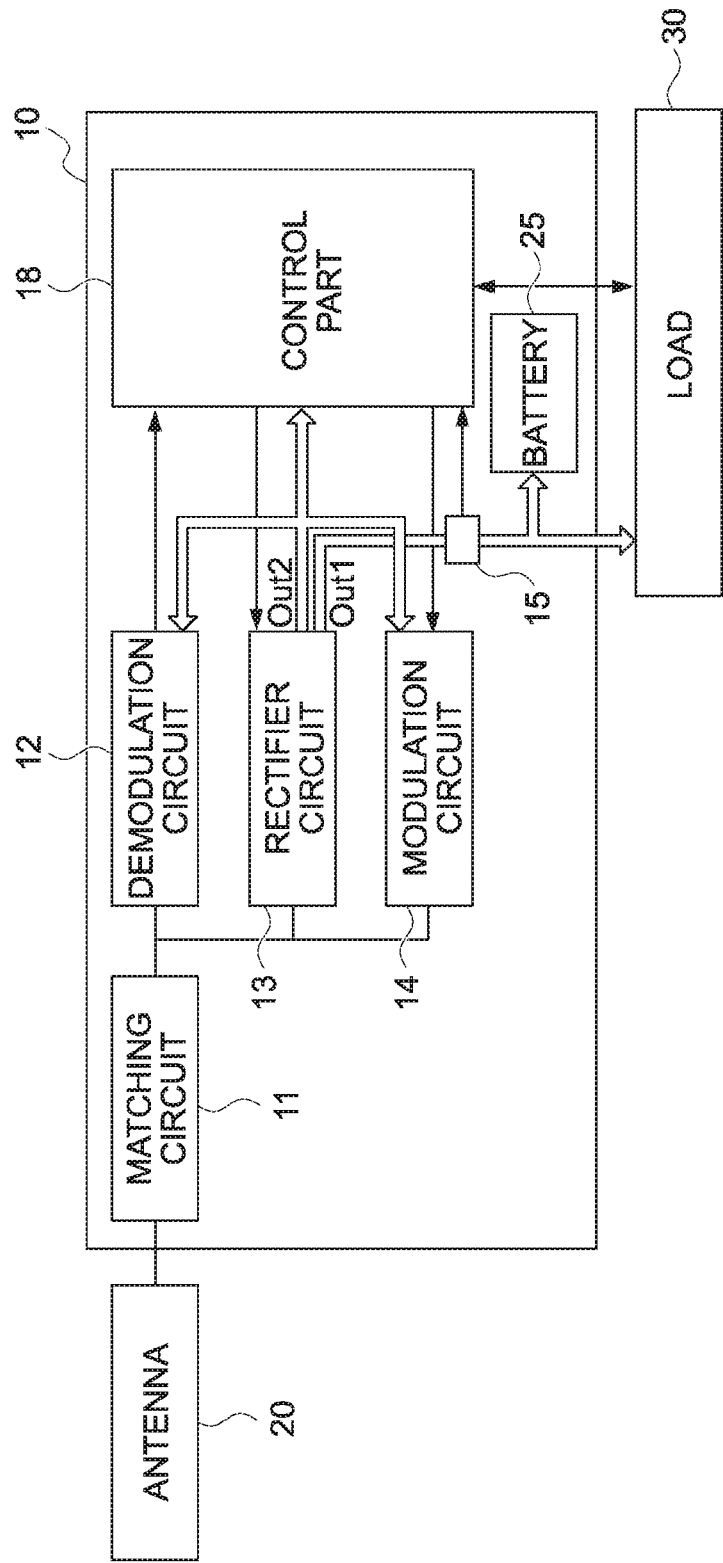
FIG. 14 is an explanatory diagram of a modification of the tag circuit according to the first and second embodiment.
Figure 15:
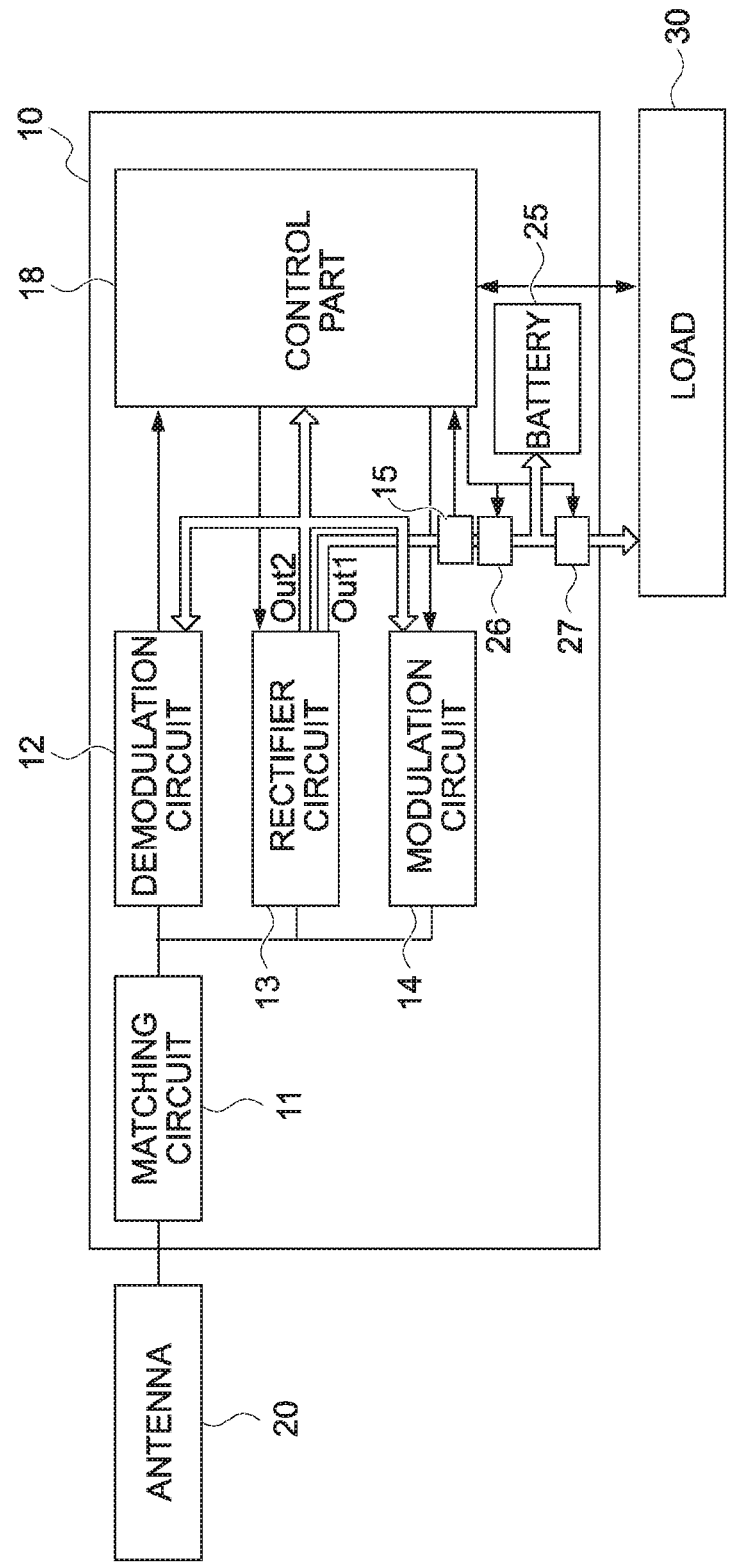
FIG. 15 is an explanatory diagram of a modification of the tag circuit according to the first and second embodiment.

The tag circuit 10 according to the respective embodiments described above can be modified in various ways. For example, as shown in FIG. 14, a battery (a capacitor or the like) 25 for storing power to be supplied to the load 30 can be added to the tag circuit 10 according to the first and second embodiments. In addition, as shown in FIG. 15, a switch 26 for enabling/disabling power supply from the rectifier circuit 13 to the battery 25 and a switch 27 for enabling/disabling power supply from the battery 25 to the load 30 may be added to the tag circuit 10 according to the first and second embodiments. When adopting the configuration shown in FIG. 15, normally, the switch 26 is turned ON and the switch 27 is turned OFF when the load is not operated. In addition, the switch 26 is turned OFF and the switch 27 is turned ON when the load is operated. Therefore, the control part 18 is preferably configured so as to perform an automatic characteristic adjustment process (for example, a process of obtaining a characteristic designation value that maximizes charge speed of the battery 25) with contents that differ from the automatic characteristic adjustment process described above.

Figure 16A:
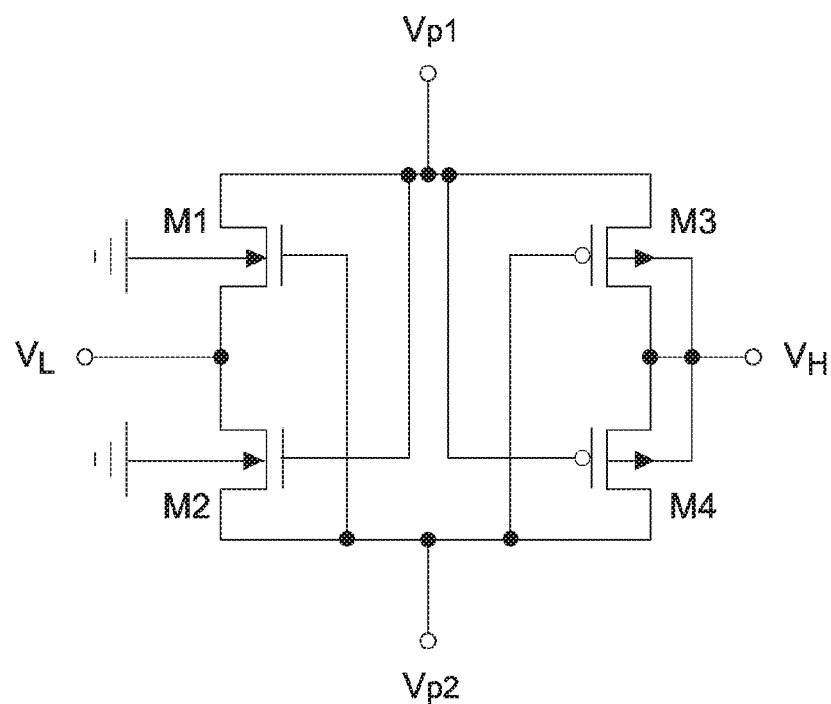
FIG. 16A is a configuration diagram of a circuit that can be used as a component of a rectifier circuit.
Figure 16B:
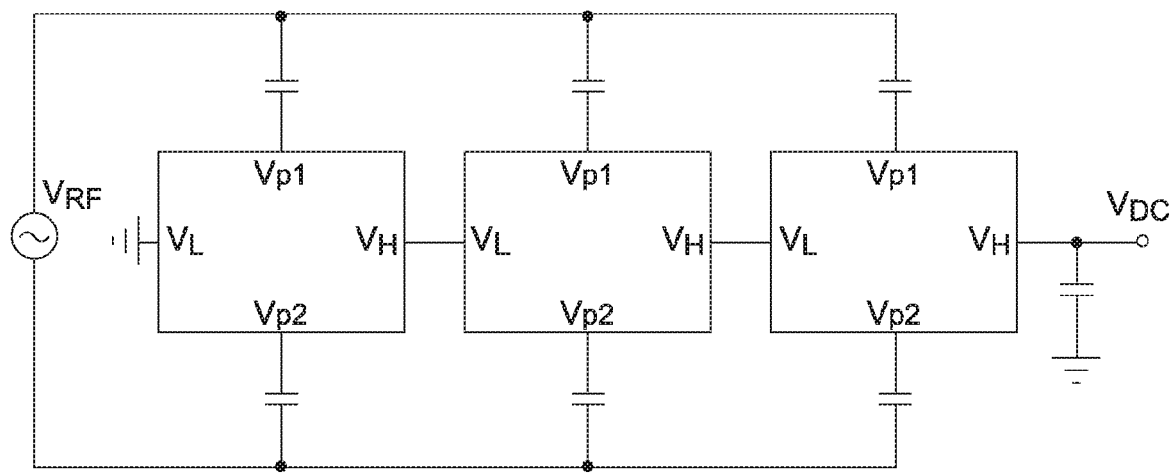
FIG. 16B is a configuration diagram of a rectifier circuit in which the circuit shown in FIG. 16A is connected in multiple stages.
Figure 17A:
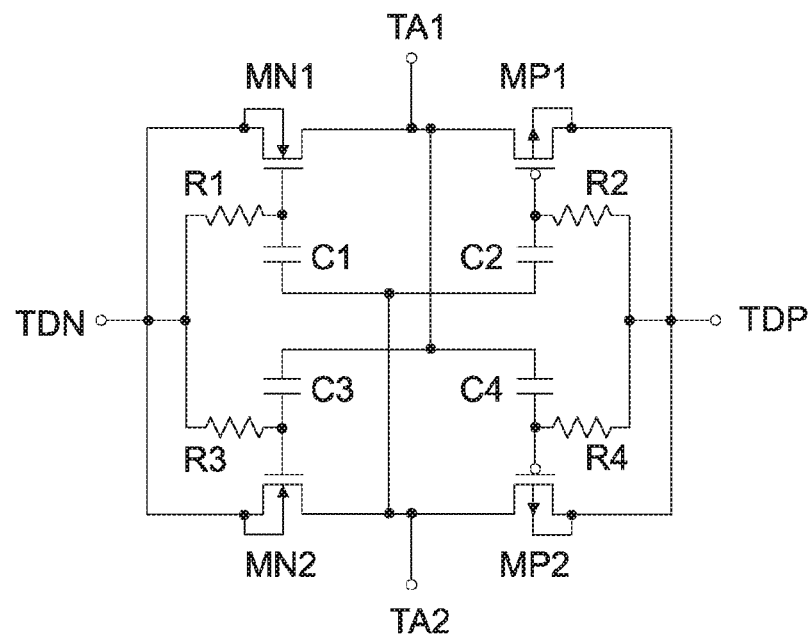
FIG. 17A is a configuration diagram of a circuit that can be used as a component of a rectifier circuit.
Figure 17B:
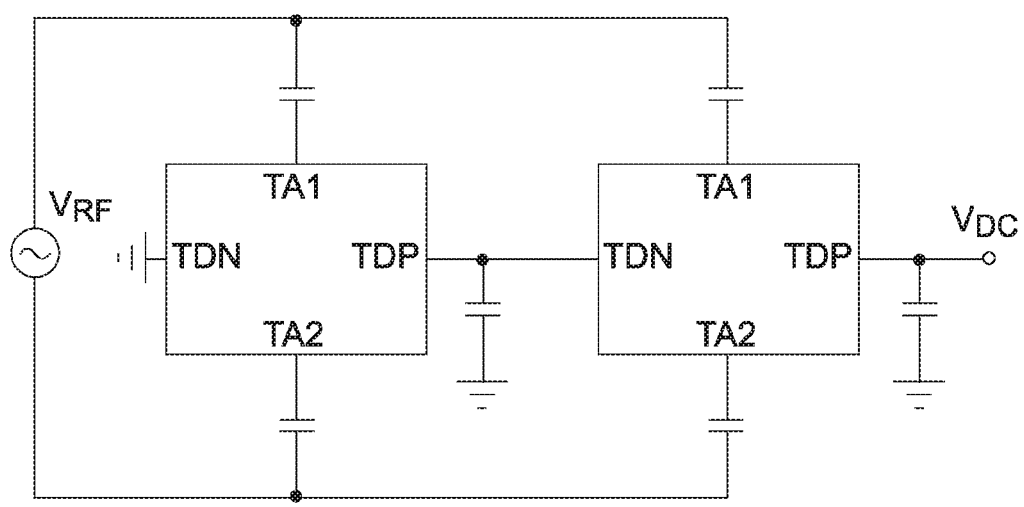
FIG. 17B is a configuration diagram of a rectifier circuit in which the circuit shown in FIG. 17A is connected in multiple stages.

In addition, the tag circuit 10 according to the third and fourth embodiments may be modified so as to include a battery or the like. A rectifier circuit 13 with a different specific configuration from that described above may be adopted for the tag circuit 10 according to the respective embodiments. Specifically, a circuit created by applying the multistage connection shown in FIG. 16B to a circuit configured as shown in FIG. 16A may be adopted as the rectifier circuit 22 (FIG. 7) or a circuit used as a basis for the rectifier circuit 13 (the rectifier circuit 13 before adding the switches). In addition, a circuit created by applying the multistage connection shown in FIG. 17B to a circuit configured as shown in FIG. 17A may be adopted as the rectifier circuit 22 or a circuit used as a basis for the rectifier circuit 13.

The tag circuit 10 according to the first and second embodiments may adopt the matching characteristics variable matching circuit 11 (a matching circuit 11 capable of adjusting impedance matching characteristics by a control signal from the control part 18). In this case, the tag circuit 10 may be configured such that the impedance matching process of controlling the matching characteristics variable matching circuit 11 so as to maximize measured voltage by the voltage measurement circuit 15 is performed after the process of step S106 (FIG. 4) or after the processes of steps S203 and/or S207 (FIG. 5).

The tag circuit 10 according to the respective embodiments may be modified so as to include a manual switch for changing (selecting) power conversion characteristics. In addition, although doing so would prevent impedance matching from being automatically performed, the tag circuit 10 according to the respective embodiments may be mounted with the matching circuit 11 of which impedance matching characteristics can be adjusted by a mechanical operation (the matching circuit 11 using a trimmer capacitor or the like).

The rectifier circuit 13 (FIG. 13) of the tag circuit 10 according to the first embodiment can be modified to a circuit in which output of the unit rectifier circuits 21 other than the final stage is used as Out2. It is needless to say that the diodes inside the rectifier circuit 13 of the tag circuit 10 according to the respective embodiments may be diode-connected transistors and that the tag circuit 10 according to the respective embodiments may be modified to a tag circuit with reduced functionality (for example, a tag circuit in which the control part 18 is incapable of performing the automatic characteristic adjustment process).

REFERENCE SIGNS LIST

10 Tag circuit
11 Matching circuit
12 Demodulation circuit
13, 22 Rectifier circuit 14 Modulation circuit
15 Voltage measurement circuit
16 Input power measurement circuit
18 Control part
20, 41 Antenna
21 Unit rectifier circuit
30 Load
26, 27 Switch
40 Reader/writer apparatus
42 Reader/writer
43 Host apparatus

The invention claimed is:

1. A tag circuit connected to an antenna and a load, the tag circuit comprising:
a control part configured to respond to a command extracted from a radio wave received by the antenna by controlling the load; and
a rectifying part configured to generate DC power to be supplied to the load by converting a radio wave received by the antenna into DC power, the rectifying part changing power conversion characteristics of converting the radio wave into DC power to be supplied to the load, wherein
the rectifying part comprises:
a charge pump comprising diodes and capacitors; and
a plurality of ON-resistance reducing elements connected in parallel to each diode of the charge pump and in which a switch and a diode are connected in series.

2. A tag circuit connected to an antenna and a load, the tag circuit comprising:
a control part configured to respond to a command extracted from a radio wave received by the antenna by controlling the load; and
a rectifying part configured to generate DC power to be supplied to the load by converting a radio wave received by the antenna into DC power, the rectifying part changing power conversion characteristics of converting the radio wave into DC power to be supplied to the load, wherein
the rectifying part includes:
a multistage rectifier circuit in which at least two rectifier circuits are connected in multiple stages and which is configured to output from a plurality of intermediate stages including a final stage; and
an output supply circuit which selectively supplies the load with an output of the multistage rectifier circuit, and
the control part changes the power conversion characteristics of the rectifying part such that DC power supplied to the load from the rectifying part is maximum power.

3. A tag circuit connected to an antenna and a load, the tag circuit comprising:
a control part configured to respond to a command extracted from a radio wave received by the antenna by controlling the load; and
a rectifying part configured to generate DC power to be supplied to the load by converting a radio wave received by the antenna into DC power, the rectifying part changing power conversion characteristics of converting the radio wave into DC power to be supplied to the load, wherein
the rectifying part includes:
at least two rectifier circuits with mutually different power conversion characteristics; and
an output supply circuit configured to selectively supply the load with outputs of the rectifier circuits, and
the control part changes the power conversion characteristics of the rectifying part such that DC power supplied to the load from the rectifying part is maximum power.

4. The tag circuit according to claim 1, wherein
the control part changes the power conversion characteristics of the rectifying part such that DC power supplied to the load from the rectifying part is maximum power.

5. The tag circuit according to claim 2, wherein
the control part controls the output supply circuit such that DC power supplied to the load is maximum power.

6. The tag circuit according to claim 1, wherein
the control part controls switches inside the plurality of ON-resistance reducing elements connected in parallel to each diode of the charge pump such that DC power supplied to the load is maximum power.

7. The tag circuit according to claim 1, wherein
the control part changes the power conversion characteristics of the rectifying part to power conversion characteristics which corresponds to an AC power value input to the rectifying part.

8. The tag circuit according to claim 1, wherein
the control part changes, in response to a command extracted from a radio wave received by the antenna being a power conversion characteristics designation command including designation information of power conversion characteristics of the rectifying part, the power conversion characteristics of the rectifying part to power conversion characteristics designated by the designation information in the power conversion characteristics designation command.

9. The tag circuit according to claim 1, wherein
the control part comprises:
a rewritable nonvolatile memory storing designation information that designates power conversion characteristics of the rectifying part, wherein
the control part is configured to change the power conversion characteristics of the rectifying part to power conversion characteristics designated by the designation information stored in the nonvolatile memory in response to the control part becoming operable due to supply of DC voltage from the rectifying part.

10. The tag circuit according to claim 1, further comprising:
a matching circuit portion for achieving impedance matching between the antenna and circuits in the tag circuit, the matching circuit portion adjusting impedance matching characteristics.

11. The tag circuit according to claim 10, wherein
the control part adjusts the impedance matching characteristics of the matching circuit portion to impedance matching characteristics corresponding to the power conversion characteristics of the rectifying part.

* * * * *